US008065646B2

(12) United States Patent
Priel et al.

(10) Patent No.: US 8,065,646 B2
(45) Date of Patent: Nov. 22, 2011

(54) METHOD AND A COMPUTER READABLE MEDIUM FOR PERFORMING STATIC TIMING ANALYSIS OF A DESIGN OF AN INTEGRATED CIRCUIT

(75) Inventors: Michael Priel, Hertzlia (IL); Dan Kuzmin, Givat Shmuel (IL); Anton Rozen, Gedera (IL); Eitan Zmora, Jerusalem (IL)

(73) Assignee: Freescale Semiconductor, Inc., Austin, TX (US)

( * ) Notice: Subject to any disclaimer, the term of this patent is extended or adjusted under 35 U.S.C. 154(b) by 387 days.

(21) Appl. No.: 12/066,225

(22) PCT Filed: Sep. 7, 2005

(86) PCT No.: PCT/IB2005/052912
§ 371 (c)(1),
(2), (4) Date: Mar. 7, 2008

(87) PCT Pub. No.: WO2007/029051
PCT Pub. Date: Mar. 15, 2007

(65) Prior Publication Data
US 2008/0250372 A1    Oct. 9, 2008

(51) Int. Cl.
*G06F 17/50*     (2006.01)
*G06F 9/455*     (2006.01)
(52) U.S. Cl. ........ 716/113; 716/106; 716/107; 716/108; 716/114; 716/132; 716/134
(58) Field of Classification Search .................. 716/1–3, 716/5–6, 18, 106, 107, 108, 113, 114, 132, 716/134; 703/13–14
See application file for complete search history.

(56) References Cited

U.S. PATENT DOCUMENTS

| | | | |
|---|---|---|---|
| 5,719,783 A * | 2/1998 | Kerzman et al. | 716/108 |
| 5,768,159 A | 6/1998 | Belkadi et al. | |
| 6,237,127 B1 | 5/2001 | Craven et al. | |
| 6,378,113 B1 * | 4/2002 | Levitsky et al. | 716/113 |
| 6,584,598 B2 * | 6/2003 | Rao et al. | 716/108 |
| 6,591,407 B1 | 7/2003 | Kaufman et al. | |
| 6,988,254 B2 * | 1/2006 | Iwanishi et al. | 716/6 |
| 7,278,126 B2 * | 10/2007 | Sun et al. | 716/114 |
| 7,747,975 B2 * | 6/2010 | Dinter et al. | 716/119 |
| 2001/0007144 A1 | 7/2001 | Terazawa | |
| 2003/0149953 A1 | 8/2003 | Whitaker et al. | |
| 2004/0040004 A1 | 2/2004 | Sakiyama et al. | |
| 2004/0143797 A1 | 7/2004 | Nguyen et al. | |
| 2004/0195690 A1 | 10/2004 | Flohr | |
| 2004/0218831 A1 | 11/2004 | Liu | |
| 2004/0237059 A1 | 11/2004 | Chen et al. | |
| 2005/0006670 A1 | 1/2005 | Zounes | |

FOREIGN PATENT DOCUMENTS
WO     0075815 A1     12/2000

* cited by examiner

*Primary Examiner* — Nghia Doan (57) ABSTRACT

A method for analyzing an design of an integrated circuit, the method includes defining possible timings of signals to be provided to the integrated circuit and calculating hold violations; characterized by including a stage of determining relationships between clock events and corresponding data/control events that ideally precede the clock events, in response to the possible timing of signals; and determining hold parameters in response to the relationships. A computer readable medium having stored thereon a set of instructions, the set of instructions, when executed by a processor, cause the processor to define at least one internal delay of a designed component, characterized by causing the processor to define a cell that is characterized by multiple hold times and multiple setup values for a certain clock skew value.

20 Claims, 7 Drawing Sheets

METHOD AND A COMPUTER READABLE MEDIUM FOR PERFORMING STATIC TIMING ANALYSIS OF A DESIGN OF AN INTEGRATED CIRCUIT

FIELD OF THE INVENTION

The present invention relates to a method and a computer readable medium for analyzing a design of an integrated circuit and especially for static timing analysis.

BACKGROUND OF THE INVENTION

Modern integrated circuits include a very large amount of logic circuits such as flip flops, logic gates and the like. The design process is relatively long and includes multiple stages such as high level description, synthesis, placement and routing, extraction, static timing analysis and the like.

Various vendors provide software tools capable of performing static timing analysis. These tools include, for example, Quartus® II of Altera™, of California U.S.A.; Timer™ of Actel™ of California, U.S.A., and PathMill® and PrimeTime™ of Synopsys™ of California, U.S.A.

Various verification and re-design stages are required before the design process is completed. Typically, the synthesis is responsive to design constraints (including timing constraints) and to the characteristics of designed components. The characteristics of multiple designed components are usually gathered in a cell library. Various vendors offer standard cell libraries, including Libra-Visa of Synopsys.

The following U.S. patent applications, all being incorporated herein by reference, illustrate various prior art cell libraries: U.S. patent application publication number 20050006670 of Zounes, U.S. Patent application publication number 20040237059 of Chen et al., U.S. patent application publication number 20040218831 of Liu, U.S. patent application publication number 20040195690 of Flohr, U.S. patent application publication number 20040143797 of Nguyen et al., U.S. patent application publication number 20040040004 of Sakiyama et al., and U.S. patent application publication number 20030149953 of Whitaker et al.

In general, it is harder to correct design errors during later stages of the design process, and especially after the placement and routing stages.

Static timing analysis usually includes analyzing, debugging and validating the timing performance of a design of an integrated circuit. During this stage the timing associated with the propagation of signals through a designed integrated circuit are calculated. Especially, this analysis checks whether the delay of a component fits the clock frequency requirements, and whether hold and setup violations occurred.

U.S. Pat. No. 6,591,407 of Kaufman et al., U.S. Pat. No. 5,768,159 of Belkadi et al., U.S. Pat. No. 6,237,127 of Craven et al., U.S. patent application publication number 2001/007144 of Terazawa, and PCT patent application publication number WO0075815 titled "An arrangement and a method relating to design of circuits", all being incorporated herein by reference, provide an overview of static timing analysis.

A hold violation is determined by checking if a data or a control input signal that is provided to a certain component was steady for at least a predefined period (referred to as a worst case hold time) relative to a corresponding clock event occurred. A clock event is usually a rising or falling edge of the clock signal.

A setup violation is determined by checking if a data or a control input signal that is provided to a certain component was steady for at least a predefined period (referred to setup period) before a corresponding clock event occurred.

The worst case hold time guarantees that regardless of the setup time the component will operate in a proper manner.

There is a need to provide an effective method for static timing analysis.

SUMMARY OF THE PRESENT INVENTION

A method and a computer readable medium for analyzing a design of an integrated circuit, as described in the accompanying claims.

BRIEF DESCRIPTION OF THE DRAWINGS

The present invention will be understood and appreciated more fully from the following detailed description taken in conjunction with the drawings in which.

DETAILED DESCRIPTION OF PREFERRED EMBODIMENTS

The following figures illustrate exemplary embodiments of the invention. They are not intended to limit the scope of the invention but rather assist in understanding some of the embodiments of the invention. It is further noted that all the figures are out of scale.

Figure 1:
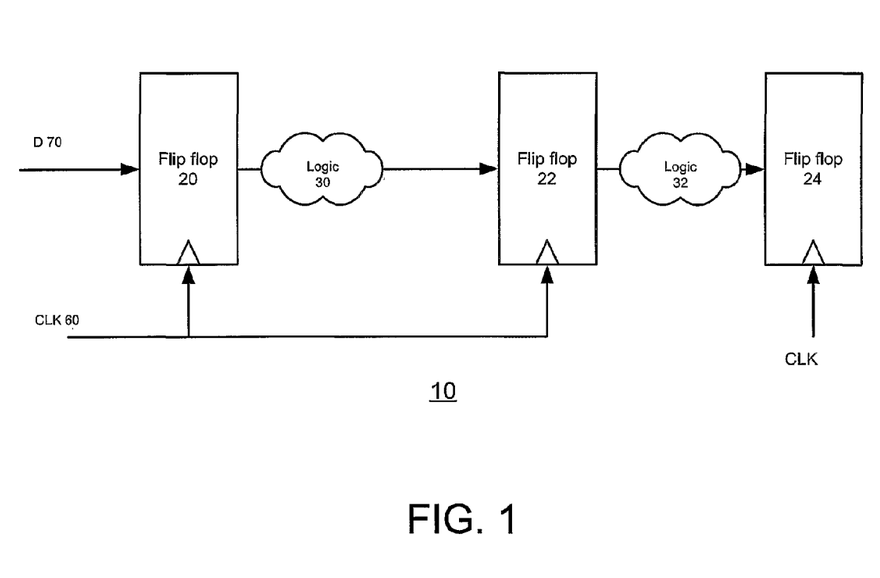
FIG. 1 illustrates an exemplary circuit.

FIG. 1 illustrates an exemplary circuit 10. Circuit 10 includes multiple components such as D-type flip-flops 20, 22 and 24, as well as additional circuitries 30 and 32 that are connected between the flip flops. It is assumed that all flip flops 20, 22 and 24 receive the same clock signal and that the clock signals provided to the different flip flops are not skewed. This is not necessarily so. It is further noted that components other than flip flops can be analyzed and that the cell library can include cells other than flip flops. Typically such a library also includes logic gates.

Each flip flop can be characterized by multiple pairs of setup times and hold times. Conveniently, longer hold times are associated with shorter setup times. For example, the inventors found that very long setup times are associated with relatively short hold times. Conveniently, the sum of one pair of setup time and its associated hold time differs from a sum of another pair of setup time and its associated hold time.

It is noted that flip flops 20, 22 and 24 can be characterized by the same mapping between multiple setup times and hold times, but this is not necessarily so.

It is further noted that multiple setup time and hold time pairs of a certain component can be fed into a design station in various manners.

Multiple circuits such as circuit 10 are usually included within an integrated circuit that can be, for example, a processor, a system on chip. The integrated circuit can be included within a large range of systems of objects such as but not limited to a stationary device or a mobile device, such as but not limited to a cellular phone, a personal data accessory, a computer, a vehicle, a satellite, and the like.

It is further noted that circuit 10 can be a part of a boundary scan register that is activated by a relatively slow clock in which hold violation (rather then setup violation) occur, but this is necessarily so.

Figure 2:
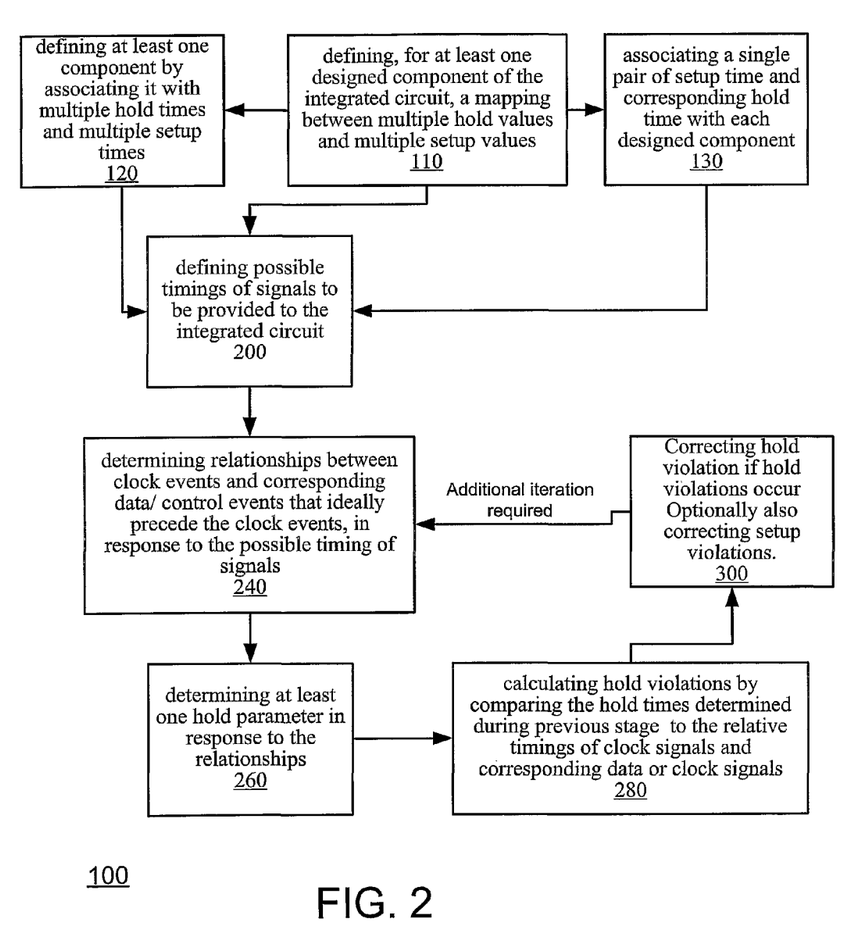
FIG. 2 illustrates a method for analyzing a design of an integrated circuit, according to an embodiment of the invention.

FIG. 2 illustrates a method 100 for analyzing a design of an integrated circuit, according to an embodiment of the invention.

Method 100 conveniently starts by stage 110 of defining, for at least one designed component of the integrated circuit, a mapping between multiple hold values and multiple setup values. Many (or all) components can be associated with such a mapping, while other components can be characterized by a single setup time and a single hold time.

Conveniently, the overall period during which a control or data signal has to be stable is not fixed. A sum of first setup time and a corresponding hold time is not necessarily the same as another sum of another setup time and a corresponding hold time. Conveniently, the relationship between the setup times and the hold times is non-linear.

According to various embodiments of the invention, once the mapping is defined it can be associated with a certain component in various alternative ways. According to one embodiment of the invention stage 110 can be followed by stage 120 of defining at least one component by associating it with multiple hold times and multiple setup times. Thus, in a cell library at least one cell definition can include these multiple setup and hold times.

According to another embodiment of the invention stage 110 is followed by stage 130 of associating a single pair of setup time and corresponding hold time with each designed component. Thus, if there are K different pairs of setup time and hold time, K different components are defined in the cell library. It is noted that according to yet a further embodiment of the invention M cells can be defined wherein K>M.

Either one of stage 110-130 is not executed for any design process. These stages are rather preliminary stages that are executed during the definition of a cell library. The cell library can be used during multiple design processes of multiple integrated circuits.

Either one of preliminary stages 110-130 is followed by stage 200 of defining possible timings of signals to be provided to the integrated circuit. This stage includes defining possible time windows during which signals can be provided to the integrated circuit. Typically, there are timing limitations imposed upon the provision of signals to the integrated circuit. The amount of typical scenarios can be very large but finite.

It is noted that the setup times and hold times can be responsive to additional parameters such as voltage, temperature and the like. The cell library can also include this relationship. According to another embodiment of the invention the cell library can include the worst setup time and/or the worst hold times for a range of possible temperatures values. The cell library can also include the worst setup time and worst hold times for a range of possible voltage supply values, and/or a combination of voltage supply and temperature values. Alternatively, the dependency between voltage and/or temperature and a range of possible setup times and/or hold times can be represented by few (even a single) setup times or hold times. This representation does not necessarily include the worst case scenario.

Stage 200 is followed by stage 240 of determining relationships between clock events and corresponding data/control events that ideally precede the clock events, in response to the possible timing of signals. A data/control event can be a control event or a data event or a combination of both. Such an event occurs when at least one data and/or control signal changes.

Stage 240 conveniently includes determining the timing of signal propagation through the designed integrated circuit and especially determining for at least one designed component, and for multiple possible signals arrival times, at least one shortest time period between an occurrence of a clock event and an occurrence of the corresponding data (or control) event.

Assuming, for example that: (i) flip flop 20 can receive a data signal from an integrated circuit pin during a first timing window, (ii) flip flop 20 is triggered by a rising edge of a clock signal that can occur during a second timing window, and (iii) a rising edge of the data signal has to precede the clock signal. Given these assumptions stage 240 can include calculating the shortest time period between the rising edge of that data signal and the rising edge of the clock signal.

It is noted that in many cases a certain component can receive (i) a first data or control signal that propagates through a first path, (ii) a second data or control signal that propagates through a second path, and (iii) a clock signal that propagates through a third path. In this case stage 240 conveniently includes calculating the time period between the latest data or control signal change and the earliest clock event. Stage 240 can include determining the setup time of each component. This setup time is conveniently the shortest setup time of each component that is still longer than the shortest acceptable time period between the change of the control or data signal and the corresponding clock signal. If no such setup time is found then setup violation occurs and has to be corrected.

Stage 240 is followed by stage 260 of determining at least one hold parameter in response to the relationships. This stage conveniently includes using the mapping between multiple setup values and the multiple hold times and finding the hold time that corresponds to the setup time found in stage 240.

Stage 260 is followed by stage 280 of calculating hold violations by comparing the hold times determined during stage 260 to the relative timings of clock signals and corresponding data or clock signals. The relative timing can include the shortest period between a clock event and a following data or control change.

Stage 280 is followed by stage 300 of correcting hold violation. Conveniently, stage 300 also includes correcting setup violations.

Stage 300 can include at least one of the following stages: (i) replacing one component by another component from the cell library that differs by its setup time or its hold time from the replaced component, (ii) introducing a delay within the path of the data or control signal that caused a hold violation, (iii) introducing multi-cycle paths, and the like.

Stage 300 can be followed by stage 240 such that stages 240-300 are repeated until the timing violations are corrected. The repetition can also be responsive to another or to an alternative control criterion, such as the amount of iterations, and the like.

It is noted that usually the timing conditions of all components of a designed integrated circuit are checked, in view of all the possible timing constraints imposed on input signals to the designed integrated circuit.

Figure 3:
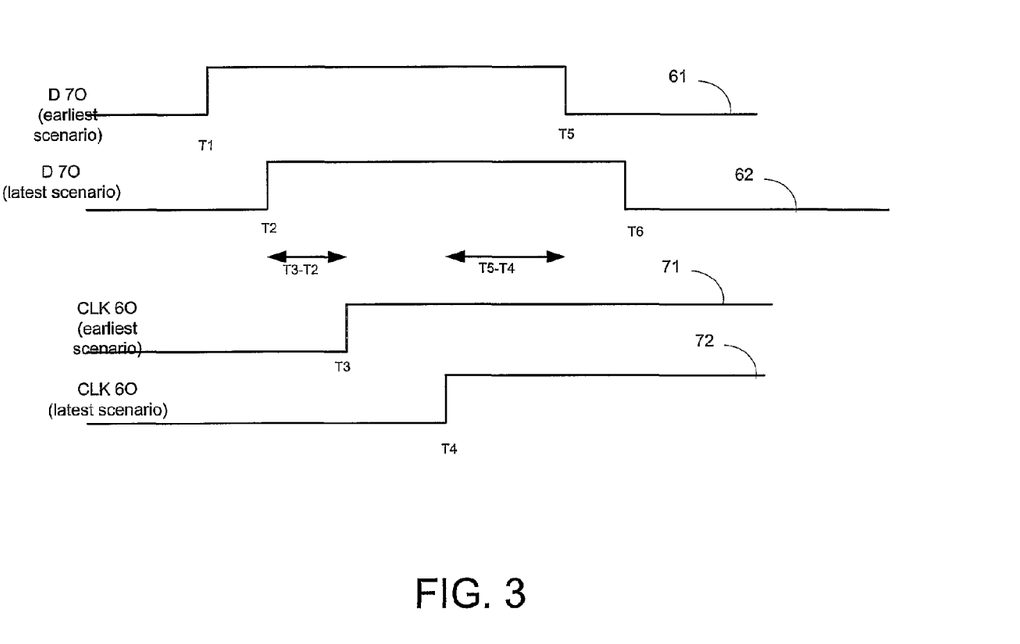
FIG. 3 illustrates various timing diagrams, according to an embodiment of the invention.

FIG. 3 illustrates various timing diagrams 61, 62, 71 and 72, according to an embodiment of the invention. For simplicity of explanation the rising period and falling period of each signal was assumed to be negligible.

It is noted that in some cases the rising period and/or falling period are taken into account when determining setup an/or hold violations.

According to an embodiment of the invention there is provided a mapping between setup times, hold times and relevant rising or falling periods of the corresponding signals. If, for example a device is triggered by a rising edge of the clock and the corresponding data raises before the rising edge of the clock and is negated after the rising edge of the clock the setup violation is responsive to the rising period of the clock signal and the rising period of the data signal. A hold violation is determined in view of the setup period, the rising period of the clock signal and the falling period of the data signal.

The timing diagrams illustrate various timing windows of various clock and data signals that arrive to flip flop 20. Each timing window is illustrated by the earliest signal and the latest signal that define the timing window.

It is assumed that flip flop 20 is triggered by the rising edge of clock signal CLK 60 and that it also receives a data signal D 70. The rising edge of CLK 60 can arrive to the clock input of flip flop 20 between T3 and T4, as illustrated by lines 61 and 62. The rising edge of CLK 60 is a clock event.

The rising edge (data event) of data signal D 70 can arrive to the data input of flip flop 20 between T1 and T2, and can be negated (another data event) between T5 and T6. It is noted that this signal can be first negated and then asserted.

Table 1 illustrates the multiple setup times and hold times that characterized flip flop 20:

| Setup time | Hold time |
|---|---|
| SU1 | H1 |
| SU2 | H2 |
| SU3 | H3 |
| SU4 | H4 |

These values are not responsive to clock skews. Clock skews can shift the timing of signals that are later compares to the setup and hold times. It is also assumed that: (i) SU1<SU2<SU3<SU4, (ii) H1>H2>H3>H4, that (SU1+H1) differs from at least one of the following sums: (SU2+H2), (SU3+H3) or (SU4+H4), and that (iv) the ratio (SU1/SU2) differs from at least one of the following ratios: (H2/H1), (H3/H2) or (H4/H3).

Given this set of assumptions stage 240 may include determining the shortest period between the assertion of the data signal D 70 and the rising edge of CLK 60. This period is T3-T2.

Stage 240 may also include calculating the shortest setup period out of SU1-SU4 that is still shorter than T3-T2. If such a setup period is not found that there is a need to correct this setup violation by various means including delays, cell replacement and the like. Assuming that such a set up period is found and that it is SU2 then stage 260, that follows stage 240, includes selecting H2 as the relevant hold time.

Stage 260 is followed by stage 280 of calculating hold violations by comparing the relevant hold time H2 to the timing difference between the latest possible CKL 60 rising edge (T4) and the earliest negation of D 70 (T5).

If (T5-T4) is shorter that H2 then a hold violation occurred. It is noted that if (T5-T4) is shorter than H4 but is longer than H2 than a hold violation does not occur, although prior art methods would determine that a hold violation occurred and perform an unnecessary hold violation correction stage.

Figure 4:
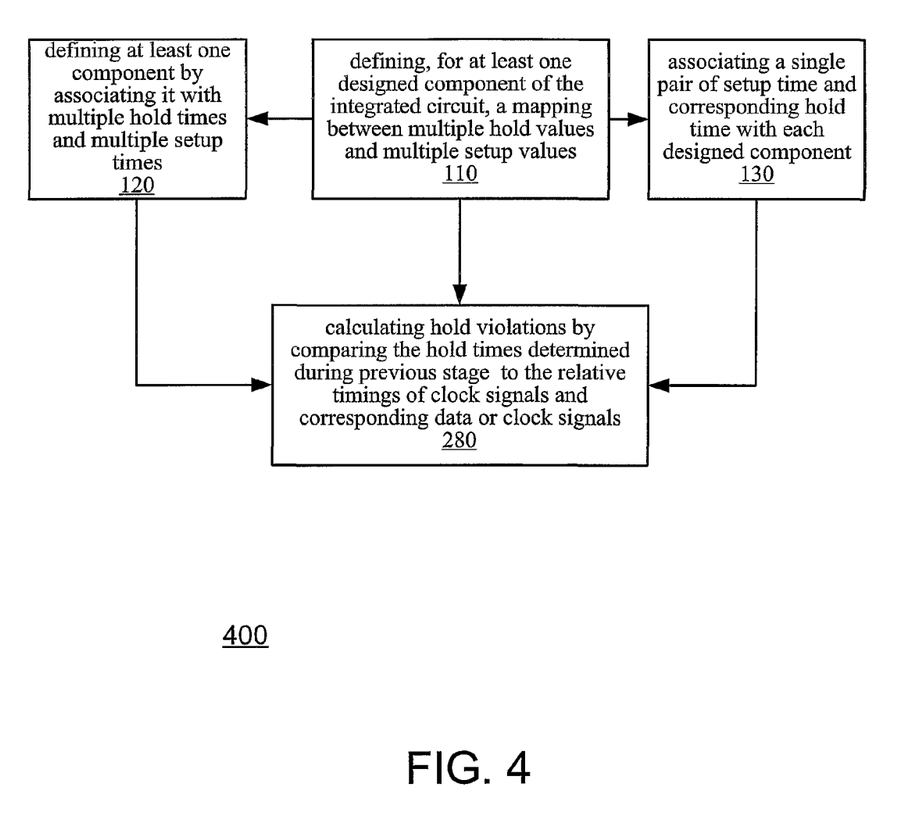
FIG. 4 illustrates a method for analyzing a design of an integrated circuit, according to an embodiment of the invention.

FIG. 4 illustrates a method 400 for analyzing an design of an integrated circuit, according to an embodiment of the invention.

Method 400 starts by stage 110 of defining, for at least one designed component of the integrated circuit, a mapping between multiple hold times and multiple setup times. This mapping is not responsive to clock skews.

Conveniently, stage 110 can be followed by optional stage 120 or 130.

Either one of stages 110-130 can be followed by stage 280 of calculating hold violations in response to the mapping.

Figure 5:
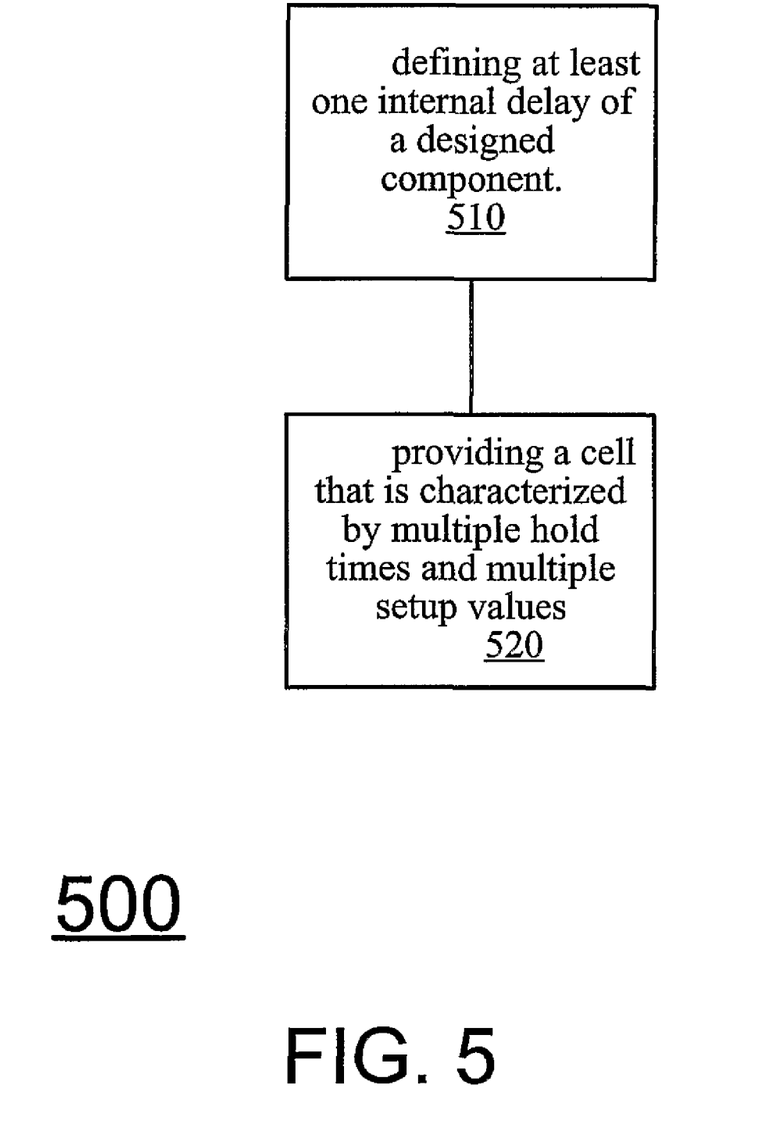
FIG. 5 illustrates a method for defining a cell library, according to an embodiment of the invention.

FIG. 5 illustrates method 500 for defining a cell library, according to an embodiment of the invention.

Method 500 starts by stage 510 of defining at least one internal delay of a designed component.

Stage 510 is followed by stage 520 of providing a cell that is characterized by multiple hold times and multiple setup values. The relationship between these times is not responsive to clock skews. Conveniently, the period during which a signal has to be stable is not fixed. A sum of first setup time and a corresponding hold time is not necessarily the same as a another sum of another setup time and a corresponding hold time. Conveniently, the relationship between the setup times and the hold times is non-linear.

According to various embodiments of the invention, once the mapping is defined it can be associated with a certain component in various alternative ways. Some of these ways are illustrated in relation to stage 110 of FIG. 2.

Figure 6:
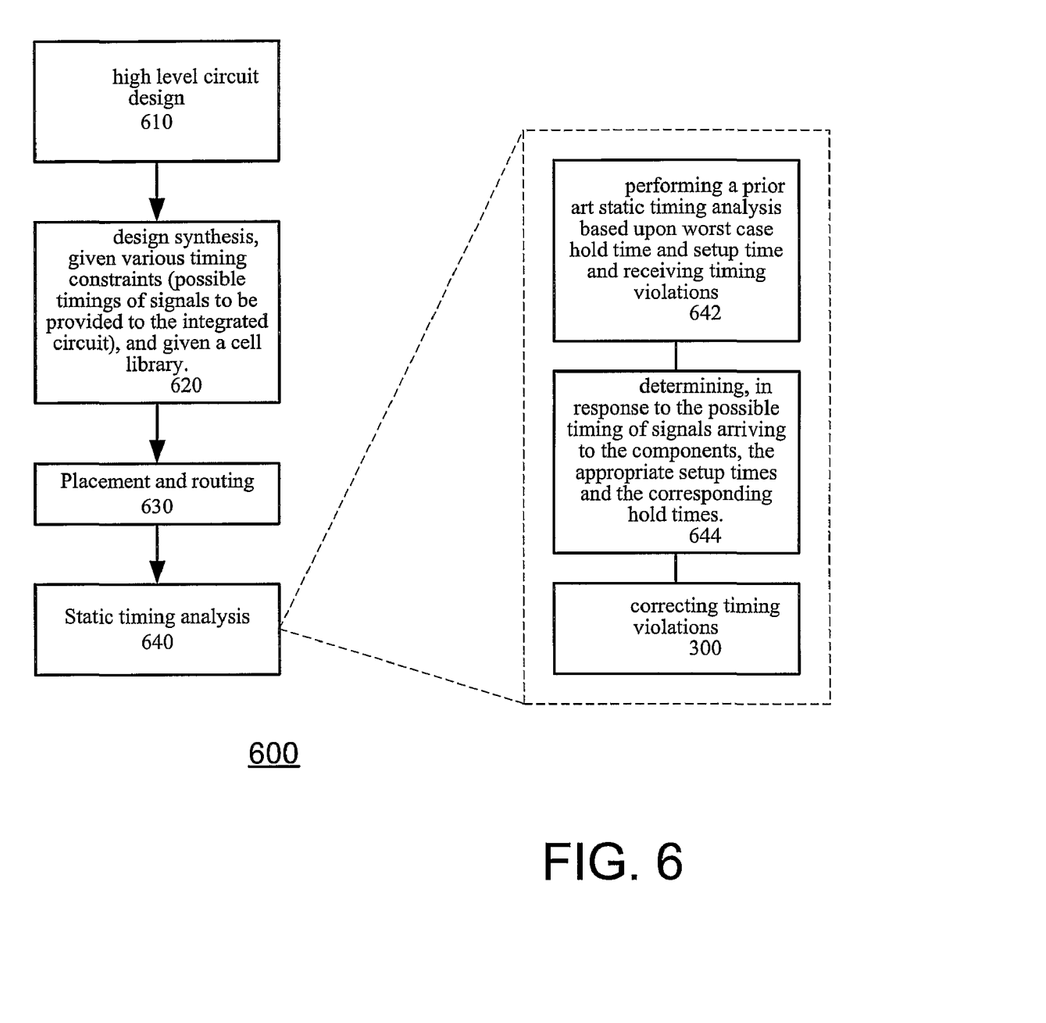
FIG. 6 illustrates an integrated circuit design process, according to an embodiment of the invention.

FIG. 6 illustrates an integrated circuit design process 600, according to an embodiment of the invention.

Process 600 starts by stage 610 of high level circuit design. This stage can include using a high level design language such as Verilog, RTL and the like. Stage 610 is followed by stage 620 of design synthesis, given various timing constraints (possible timings of signals to be provided to the integrated circuit), and given a cell library.

The cell library or at least some of the cells of the cell library can be defined by using stages 110-130 or stages 510-520. Some of the content of the cell library can be determined in prior art manners, such as receiving a standard cell library, using predefined cell libraries and the like.

Stage 620 is followed by stage 630 of performing placement and routing.

Stage 630 is followed by stage 640 of performing static timing analysis. According to an embodiment of the invention stage 640 can includes include various stages of method 100 or method 400. According to another embodiment of the invention these stages can be applied in combination with prior art static timing analysis stages.

According to yet another embodiment of the invention stage 640 can include stage 642 of performing a prior art static timing analysis based upon worst case hold time and setup time and receiving timing violations. Stage 642 is followed by stage 644 of determining, in response to the possible timing of signals arriving to the components, the appropriate setup times and the corresponding hold times. Stage 644 can include stage 240 and 260.

Stage 644 is followed by stage 300 of correcting timing violations.

Figure 7:
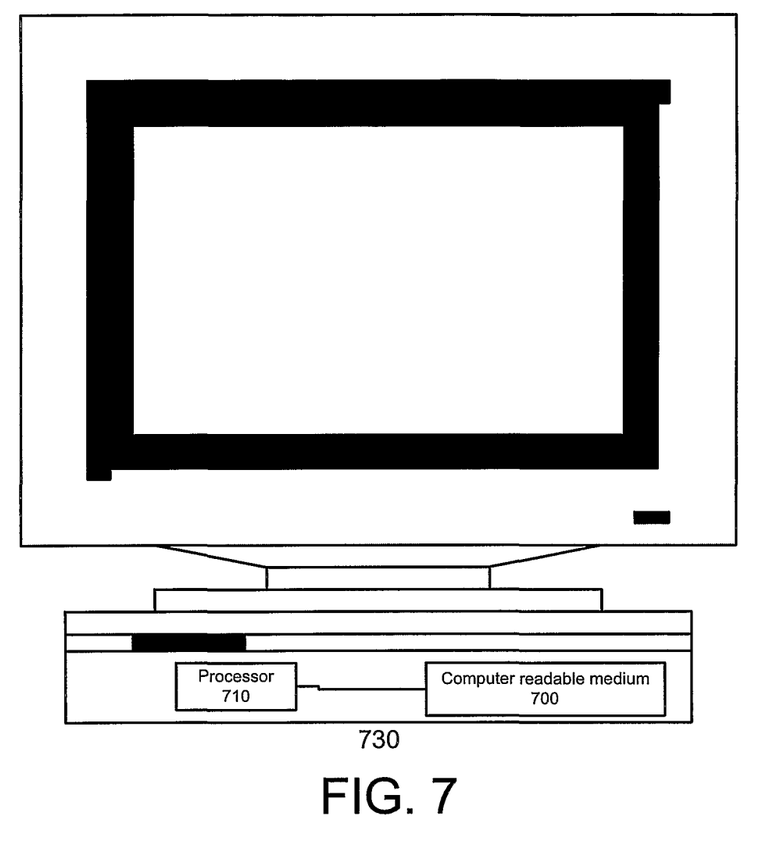
FIG. 7 illustrates a design station, according to an embodiment of the invention.

FIG. 7 illustrates a design station 710, according to an embodiment of the invention.

The design station can be a stand-alone station or part of a network or a group of design station.

The design station is illustrated, for convenience of explanation as a desktop computer 710 that includes a processor 720 as well as a computer readable medium 700 that stores a set of instructions to be executed by the processor 720. The processor 720 can access a cell library 750 during the various design stages.

It is noted that many design station configurations are known in the art and can be applied. The design can be implemented by many designers that have access to multiple design stations that in turn can access remote storage devices that can store cell libraries, instructions, integrated circuit designs and the like.

According to various embodiments of the invention the mentioned above methods (100, 400, 500, 600) can be executed by a processor that executed a set of instructions that is stored within a computer readable medium. This medium can include magnetic storage devices (such as magnetic tape, diskettes, disk drives), optical storage devices (such as DVD, CD) and the like. The processor can execute the method in cooperation with other components such as storage unit, buses and the like.

According to an embodiment of the invention a computer readable medium is provided having stored thereon a set of instructions, the set of instructions, when executed by a processor, cause the processor to define possible timings of signals to be provided to the integrated circuit, to determine relationships between clock events and corresponding data/control events that ideally precede the clock events, in response to the possible timing of signals, and determine hold parameters in response to the relationships and to calculate hold violations.

According to an embodiment of the invention a computer readable medium is provided having stored thereon a set of instructions, the set of instructions, when executed by a processor, cause the processor to define, for at least one designed component of the integrated circuit, a mapping between multiple hold times and multiple setup values, and to calculate hold violations.

According to an embodiment of the invention a computer readable medium is provided having stored thereon a set of instructions, the set of instructions, when executed by a processor cause the processor to define cell that is characterized by multiple hold times and multiple setup times.

Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

We claim:

1. A method comprising:
 performing at a computer a static timing analysis of an integrated circuit device design, the device design including an instance of a component included at a cell library, the cell library including a lookup table determined prior to performing the static timing analysis and providing timing characteristics of an input of the component;
 determining at the computer a first setup time of a signal at the input of the instance based on the static timing analysis, the first setup time relative to an arrival time at the instance of a related signal;
 receiving, from the cell library, a first hold time requirement corresponding to the input, the first hold time requirement determined based on the first setup time using the lookup table, the lookup table providing a relationship between each setup time of a set of setup times and a corresponding one of a set of hold time requirements, each set corresponding to the input; and
 determining at the computer whether the first hold time requirement is satisfied based on delay information provided by the static timing analysis.

2. The method of claim 1 where the relationship is responsive to a temperature parameter.

3. The method of claim 1 wherein the first setup time is determined based on static timing analysis of a first logic path corresponding to the input.

4. The method of claim 1 wherein determining the first setup time comprises identifying a latest transition time at the input prior to the arrival of the related signal.

5. The method of claim 1 further comprising correcting a first hold violation at the input in response to determining that the first hold time requirement is not satisfied.

6. The method of claim 1 wherein the relationship is nonlinear.

7. The method of claim 1 wherein the relationship is responsive to a voltage parameter.

8. The method of claim 1 further comprising:
 determining at the computer a second setup time at the input of the instance based on the static timing analysis, the second setup time relative to the related signal; and
 receiving, from the cell library, a second hold time requirement corresponding to the input, the second hold time requirement determined based on the second setup time using the lookup table.

9. The method of claim 8 wherein the first setup time is greater than the second setup time and the first hold time requirement is less than the second hold time requirement.

10. A tangible computer readable medium having stored thereon a set of instructions, the set of instructions, when executed by a processor, cause the processor to:
 determine a latest arrival time of a first signal at an input of an instance of a component at an integrated circuit device design using static timing analysis;
 determine a first setup time, the first setup time based on the latest arrival time of the first signal relative to an arrival time at the instance of a related signal;
 receive from a cell library a first hold time requirement corresponding to the input, the first hold time requirement determined based on the first setup time using a lookup table, the lookup table providing a relationship between each setup time of a set of setup times and a corresponding one of a set of hold time requirements, the lookup table determined prior to performing the static timing analysis; and
 determine whether the first hold time requirement is satisfied based on delay information provided by the static timing analysis.

11. The computer readable medium of claim 10 wherein determining the latest arrival time of the first signal comprises performing a static timing analysis of all logic paths corresponding to the input.

12. The computer readable medium of claim 10 wherein the relationship is nonlinear.

13. The computer readable medium of claim 10 wherein the relationship is responsive to a temperature parameter.

14. The computer readable medium of claim 10 further comprising instructions to:
 determine a second setup time, the second setup time relative to the related signal; and
 receive from the cell library a second hold time requirement corresponding to the input, the second hold time requirement determined based on the second setup time using the lookup table.

15. The computer readable medium of claim 14 wherein the first setup time is greater than the second setup time and the first hold time requirement is less than the second hold time requirement.

16. A method comprising:
- determining using a computer timing characteristics of a component included at a component library, the timing characteristics provided using a lookup table and including:
  - a first hold time requirement of an input of the component based on a first setup time of a signal at the input, the first setup time relative to an arrival of a related signal at the component; and
  - a second hold time requirement of the input based on a second setup time of the signal at the input, the second setup time relative to the related signal and different from the first setup time;
- performing, at the computer and after the determining, a static timing analysis of an integrated circuit device design, the device design including an instance of the component, the static timing analysis providing a worst-case setup time corresponding to the input of the component;
- receiving from the component library a minimum hold time requirement corresponding to the input, the minimum hold time requirement determined based on the worst-case setup time using the lookup table; and
- determining at the computer whether the minimum hold time requirement is satisfied based on delay information provided by the static timing analysis.

17. The method of claim 16 wherein the timing characteristics further include:
- a third hold time requirement of the input of the component based on a third setup time of the signal at the input, the third setup time relative to the arrival of the related signal at the component.

18. The method of claim 16 wherein the first hold time requirement and the second hold time requirement are responsive to a temperature parameter.

19. The method of claim 16 wherein the timing characteristics are responsive to a temperature parameter.

20. The method of claim 16 wherein the first setup time is greater than the second setup time and the first hold time requirement is less than the second hold time requirement.

\* \* \* \* \*